United States Patent [19]

Soneda et al.

[11] Patent Number: 4,694,341
[45] Date of Patent: Sep. 15, 1987

[54] SAMPLE-AND-HOLD CIRCUIT

[75] Inventors: Mitsuo Soneda; Yoshikazu Hazama, both of Kanagawa, Japan

[73] Assignee: Sony Corporation, Tokyo, Japan

[21] Appl. No.: 826,019

[22] Filed: Feb. 4, 1986

[30] Foreign Application Priority Data

Feb. 4, 1985 [JP] Japan .................. 60-14467[U]
Feb. 9, 1985 [JP] Japan .................. 60-17310[U]

[51] Int. Cl.⁴ .................. H04N 5/44; G11C 27/02
[52] U.S. Cl. .................. 358/160; 328/151; 307/353; 307/475
[58] Field of Search .......... 358/160, 148; 307/352, 307/353, 475; 328/151; 340/721, 722

[56] References Cited

U.S. PATENT DOCUMENTS

| | | | |
|---|---|---|---|
| 4,066,919 | 1/1978 | Huntington | 307/353 |
| 4,331,894 | 5/1982 | Gregorian et al. | 307/352 |
| 4,404,479 | 9/1983 | Toyomaki | 307/353 |
| 4,429,239 | 1/1984 | Gay | 307/352 |
| 4,560,890 | 12/1985 | Masuda et al. | 307/352 |

FOREIGN PATENT DOCUMENTS 0169291 12/1981 Japan .................. 307/353

OTHER PUBLICATIONS

Sample-Hold Circuit is Inexpensive and Stable, Electronic 14, Jul. 4, 1968, p. 94.

Primary Examiner—Tommy P. Chin
Attorney, Agent, or Firm—Hill, Van Santen, Steadman & Simpson

[57] ABSTRACT

A sample-and-hold circuit is provided wherein an input signal is fed via a first gate element to one end of a first capacitor whose other end is alternately grounded, the one end of the first capacitor being connected via a second capacitor to a gate (or base) of a source (or emitter) follower transistor to obtain an output from the source (or emitter) of the transistor which is connected via a second gate element to one end of the first capacitor, while the gate (or base) of the transistor is connected via a third gate element to a DC voltage supply having a predetermined voltage value, and the second and third gate elements are turned on during a first period of the input signal so that a voltage corresponding to the gate-source (or base-emitter) offset voltage of the transistor is stored in the second capacitor, while the first gate element is turned on during a second period of the input signal to produce an output signal equivalent in level to the input signal.

4 Claims, 35 Drawing Figures

FIG. 1
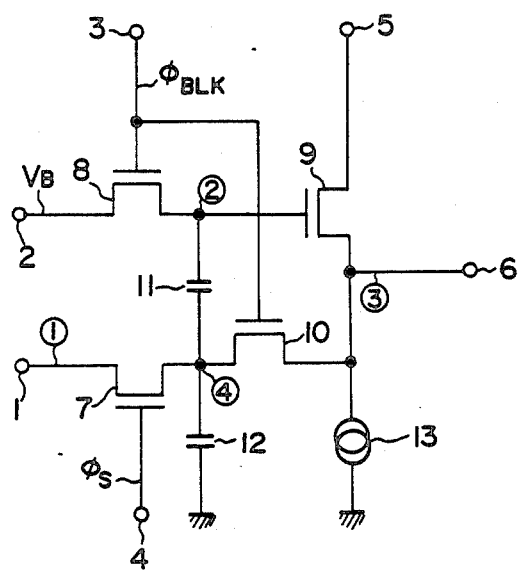
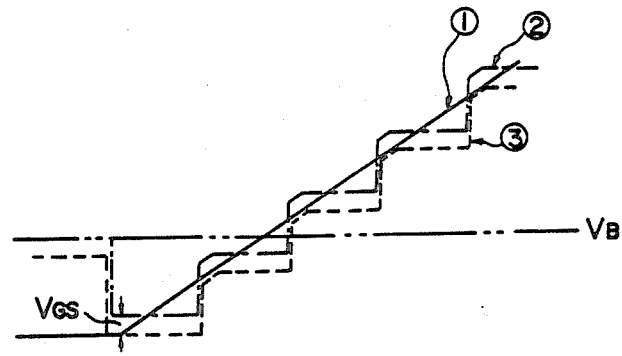
FIG. 2A
FIG. 2B  $\phi_{BLK}$ 
FIG. 2C  $\phi_S$ 

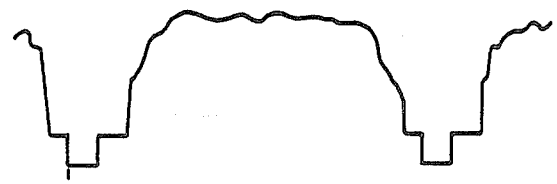
FIG. 3A
FIG. 3B
FIG. 3C
FIG. 4
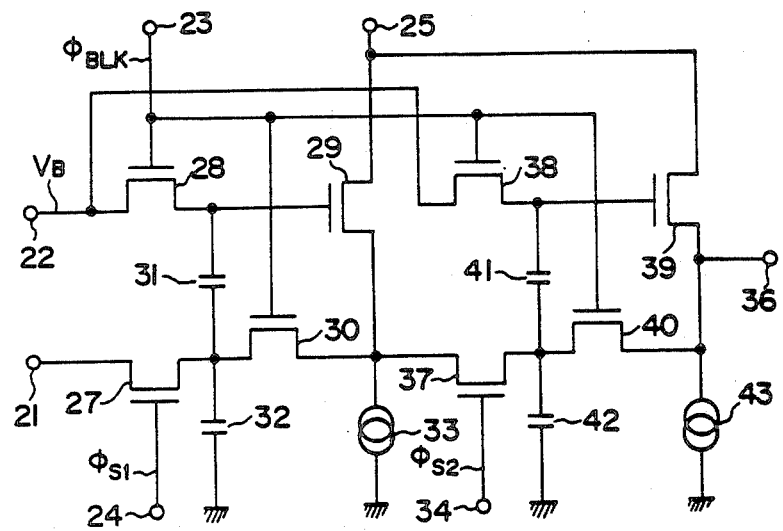

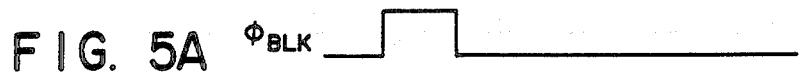
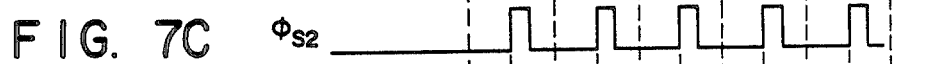
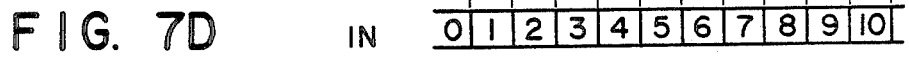
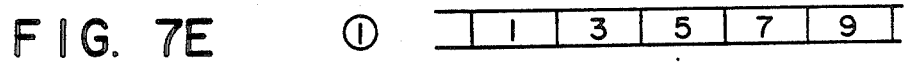

FIG. 10
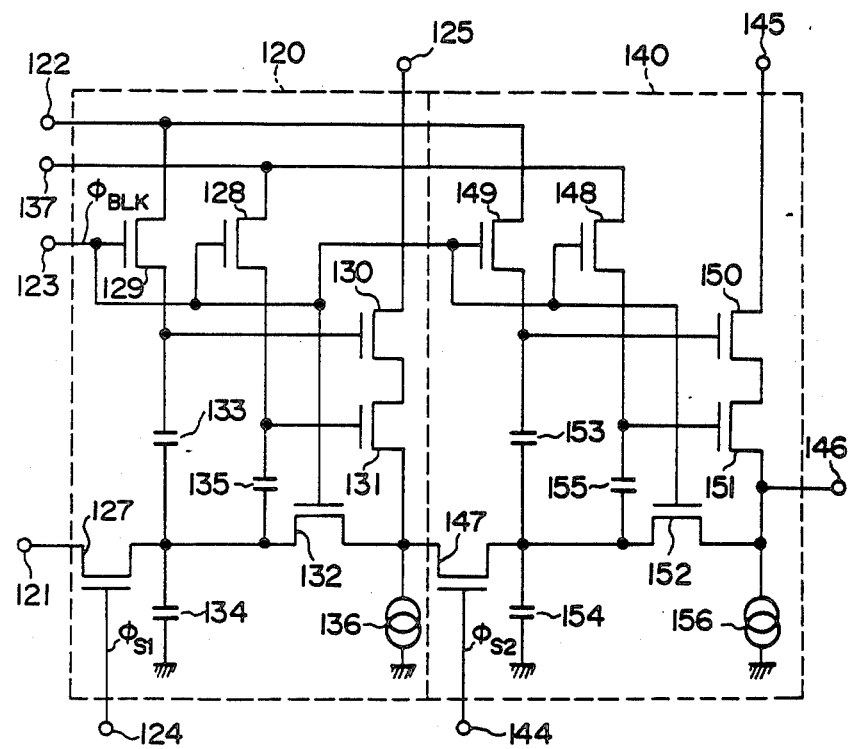
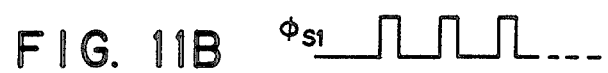
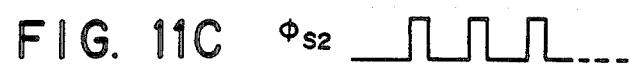

FIG. 12 (PRIOR ART)
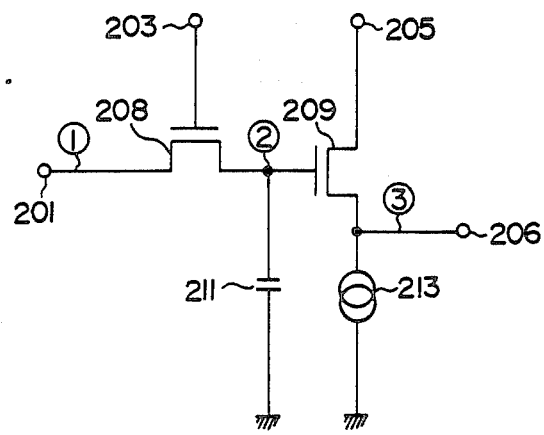
(PRIOR ART)
FIG. 13A
FIG. 13B
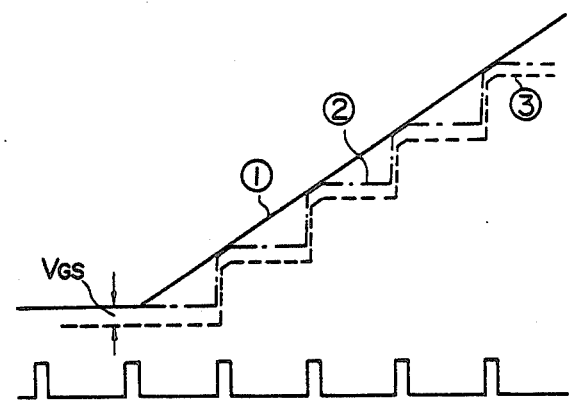

FIG. 14
(PRIOR ART)
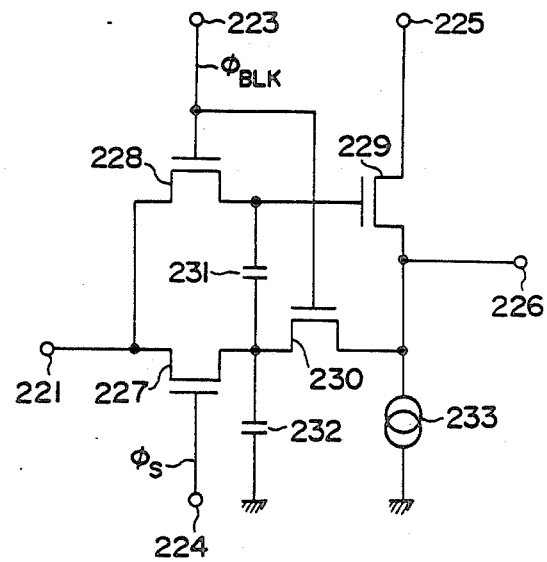
FIG. 15A
(PRIOR ART)
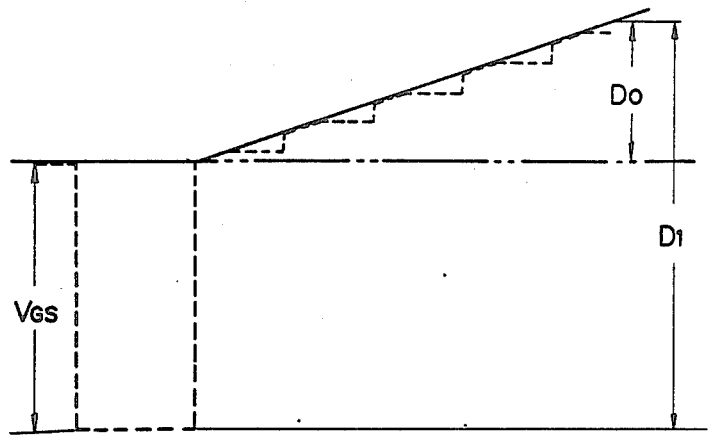
FIG. 15B $\phi_{BLK}$
FIG. 15C $\phi_S$
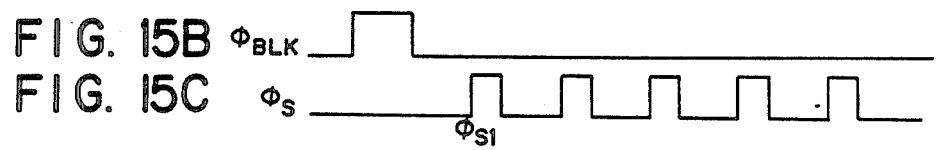

SAMPLE-AND-HOLD CIRCUIT

BACKGROUND OF THE INVENTION

1. Field of the Invention

The present invention relates to a sample-and-hold circuit adapted for a video signal or the like having a blanking period per predetermined cycle, and more particularly to an improved circuit so designed as to produce an output signal without any difference relative to the gate-source offset voltage induced by a buffer of a source follower or the like.

2. Description of the Prior Art

In the conventional circuit for sampling and holding an input such as a video signal, there is known an exemplary configuration of FIG. 12. In this example, a signal received at an input terminal 201 is fed to a gating MOS transistor 208 which is turned on by a sampling pulse fed thereto from a terminal 203. The output signal of the MOS transistor 208 is fed to a holding capacitor 211, which then produces a signal fed to the gate of a buffer MOS transistor 209. A line voltage is applied through a power terminal 205 to the drain of the MOS transistor 209, whose source is grounded via a constant current source 213. And the signal produced at the source of the MOS transistor 209 is fed to an output terminal 206.

In the circuit configuration mentioned above, a buffer circuit composed of a source follower is provided in the output stage. Accordingly, when sampling pulses of FIG. 13B are fed from the terminal 203, signals obtained in the individual stages become such as shown in FIG. 13A. In this chart, a solid line represents the waveform of an input voltage applied to the input terminal 201 (point ①); a one-dot chain line represents the waveform of a voltage at the gate (point ②) of the MOS transistor 209; and a broken line represents the waveform of an output voltage produced at the output terminal 206 (point ③). As is clear from FIG. 13A, there occurs in the output a drop of VGS (offset voltage) which is expressed as $$V_{GS} = V_{th} + \frac{I_o}{\frac{\mu C_{ox}}{2} \frac{W}{L}}$$

where $V_{th}$ is a threshold voltage of the MOS transistor 209; $\mu$ is a mobility of the carrier; $C_{ox}$ is a gate capacity per unit area; W is a channel width; L is a channel length; and $I_o$ is a current value of the constant current supply 213.

It follows, therefore, that some problems are unavoidable including DC potential variation between the input and the output as well as so-called 1/f noise derived from nonuniformity of the threshold voltage $V_{th}$, drift of the current $I_o$ and so forth.

In an arrangement where a plurality of sample-and-hold circuits are connected in series with one another, a voltage drop of $V_{GS}$ occurs in each stage, so that a great DC variation is induced in total between the input and the final output.

In an attempt to eliminate such disadvantages, an improved circuit configuration of FIG. 14 has already been proposed by the present applicant. In the circuit of FIG. 14, there are shown an input terminal 221, a terminal 223 to be fed with a blanking pulse $\phi_{BLK}$, and a terminal 224 to be fed with a sampling pulse $\phi_S$.

A drain of a gating MOS transistor 227 is connected to the input terminal 221, and a gate thereof is connected to the terminal 224. Meanwhile a source of the MOS transistor 227 is connected via a capacitor 231 to a gate of an enhancement-type output MOS transistor 229 while being grounded via a capacitor 232 and is further connected to a drain of a gating MOS transistor 230. A drain of another gating MOS transistor 228 is connected to the input terminal 221, while a gate and a source thereof are connected respectively to the terminal 223 and the gate of the transistor 229. The gate of the gating MOS transistor 230 is connected to the terminal 223, and its source is connected to the source of the enhancement-type output MOS transistor 229, whose drain is connected to a power terminal 225. A constant current supply 233 is connected to the source of the MOS transistor 229, which is led out to an output terminal 226.

In the sample-and-hold circuit of FIG. 14 mentioned above, when a blanking pulse $\phi_{BLK}$ of FIG. 15B and a sampling pulse $\phi_S$ of FIG. 15C are fed respectively to the terminal 223 and the terminal 224, then signals of FIG. 15A are obtained in the individual stages, where a solid line represents an input voltage applied to the input terminal 221, and a broken line represents an output voltage produced at the output terminal 226.

In case a blanking pulse $\phi_{BLK}$ is fed when the input terminal 221 has a voltage $V_{S0}$, the transistors 228 and 230 are turned on so that the gate potential of the MOS transistor 229 becomes $V_{S0}$ while the source potential (at the output terminal 226) is reduced by $V_{GS}$ through the MOS transistor 229 as $V_{S0}-V_{GS}$, whereby the potential at the junction of the MOS transistor 230 and the capacitor 232 is changed as $V_{S0}-V_{GS}$. Consequently the difference between the gate potential and the source potential of the MOS transistor 229 becomes as follows, and a charge corresponding to such potential difference is stored in the capacitor 231.

$$V_{S0}-(V_{S0}-V_{GS})=V_{GS}$$

The MOS transistors 228 and 230 are turned off in the state described above, and a sampling pulse $\phi_S$ is fed. In case the potential at the input terminal 121 is $V_{S1}$ when a first sampling pulse $\phi_{S1}$ is fed, the potential $V_{S1}$ is obtained also at the junction of the transistor 227 and the capacitor 232. Since the charge corresponding to the aforesaid potential difference $V_{GS}$ is previously stored in the capacitor 231 in response to the blanking pulse $\phi_{BLK}$, the potential at the junction of the capacitor 231 and the transistor 229 is increased to be $V_{S1}+V_{GS}$. As a result, the potential at the output terminal 226 becomes $$(V_{S1}+V_{GS})-V_{GS}=V_{S1}$$

which is equal to the potential at the input terminal 221.

The above operation is performed at each sampling time and therefore enables the sampled potential to appear at the output without any variation despite the drop of $V_{GS}$ induced by the buffer.

In the sample-and-hold circuit of FIG. 14 where the enhancement-type MOS transistor 229 is employed in its output stage, the input signal level needs to be higher than at least the threshold voltage $V_{th}$ of the MOS transistor 229. Accordingly the dynamic range of the circuit is required to be $D_1$ which is greater than the essential signal dynamic range (e.g. $D_0$) by a value corresponding to the offset voltage $V_{GS}$.

Furthermore, due to the Early effect, there occurs a variation in the offset voltage $V_{GS}$ of the MOS transistor 229 with a shift of the operation point. Consequently a problem arises with regard to a resultant difference between the sample voltage $V_{GS}$ held in the capacitor 231 during the blanking period and the actual voltage $V_{GS}$ of the MOS transistor 229 at any time other than the blanking period.

Furthermore, in the circuit configuration mentioned above, an input capacity $C_{IN}$ is generated alternatingly in the output-stage MOS transistor 229 as viewed from the input signal source. Consequently the output from the source of the MOS transistor 229 is produced with a delay, and there exists another problem that the power consumption increases with charge and discharge of the input capacity $C_{IN}$. $C_{in}$ is the input capacity of transistor 229.

SUMMARY OF THE INVENTION

It is therefore an object of the present invention to provide an improved sample-and-hold circuit which is capable of accurately canceling the gate-source offset voltage $V_{GS}$ in the output stage and thereby producing an output voltage without any voltage difference of $V_{GS}$ relative to the input voltage with another advantage of minimizing the required dynamic range.

Another object of the present invention is to provide an improved sample-and-hold circuit which is capable of reducing the input capacity of the buffer MOS transistor as viewed from the input signal source.

According to an aspect of the present invention, an input signal is fed via a first gate element to one end of a first capacitor whose other end is alternately grounded, the one end of the first capacitor being connected via a second capacitor to a gate (or base) of a source (or emitter) follower transistor to obtain an output from the source (or emitter) of the source follower transistor which is connected via a second gate element to one end of the first capacitor, while the gate (or base) of the source follower transistor is connected via a third gate element to a DC voltage supply having a predetermined voltage value, and the second and third gate elements are turned on during a first period of the input signal so that a voltage corresponding to the gate-source (or base-emitter) offset voltage of the source follower transistor is stored in the second capacitor, while the first gate element is turned on during a second period of the input signal to reduce an output signal equivalent in level to the input signal.

BRIEF DESCRIPTION OF THE DRAWINGS

FIG. 1 is a connection diagram of an exemplary embodiment of the present invention;

FIG. 2A to 2C are waveform charts for explaining the operation in the exemplary embodiment of FIG. 1;

FIG. 3A to 3C are waveform charts of signals in individual stages of a buffer circuit to which the present invention is applied;

FIG. 4 is a connection diagram of another embodiment of the invention;

FIG. 5A to 5C are waveform charts for explaining the operation of the embodiment of FIG. 4;

FIG. 7A to 7H are waveform charts for explaining the operation in the embodiment of FIG. 6;

FIG. 10 is a connection diagram of a still further embodiment of the present invention;

FIG. 11A to 11C are waveform charts of signals for explaining the operation in the embodiment of FIG. 10;

FIGS. 12 and 14 are connection diagrams of conventional sample-and-hold circuits;

and FIGS. 13A to 13B and 15A to 15C are waveform charts for explaining the operations in the conventional sample-and-hold circuits.

DESCRIPTION OF THE PREFERRED EMBODIMENT

Figure 6:
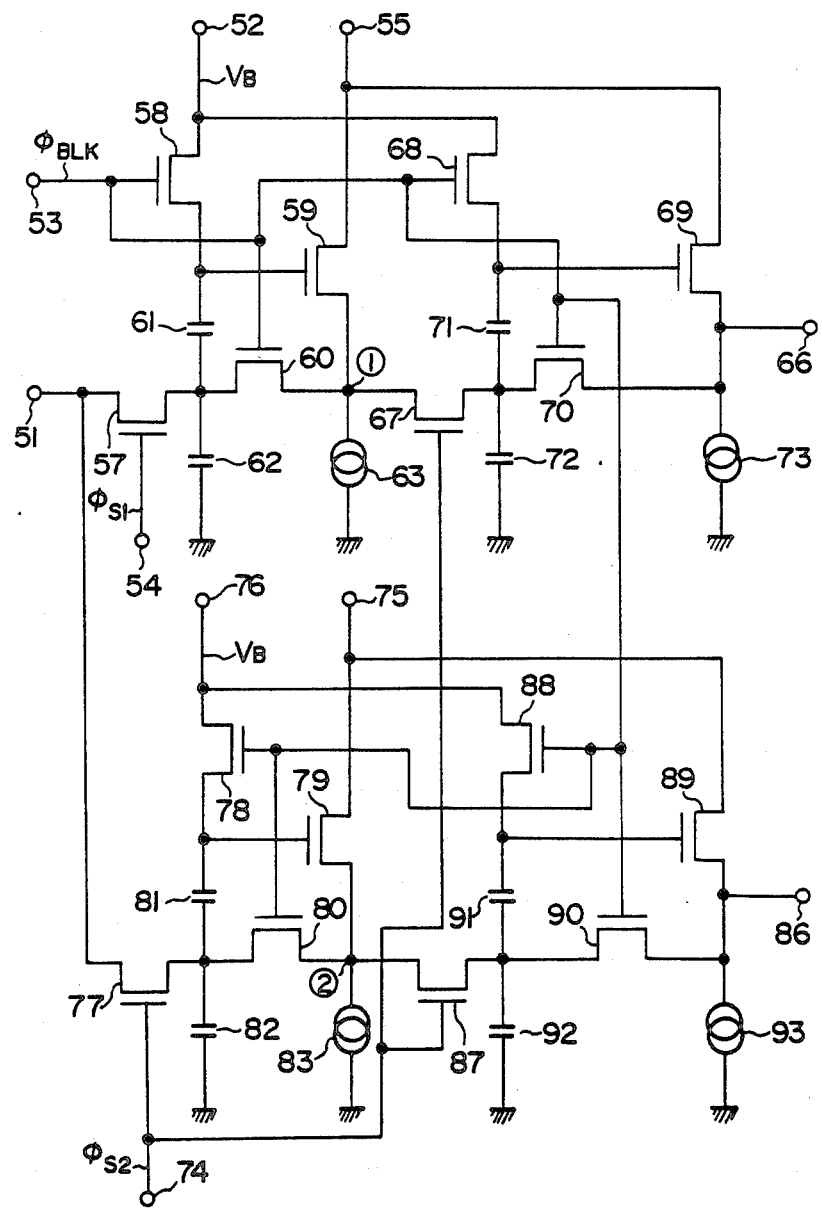
FIG. 6 is a connection diagram of a further embodiment of the invention.

Hereinafter an exemplary embodiment of the present invention will be described with reference to the accompanying drawings. In FIG. 1 shown at 1 is an input terminal to which a video signal or the like is fed.

The drain of a gating MOS transistor 7 is connected to the input terminal 1, and the gate thereof is connected to a terminal 4 to be fed with a sampling pulse $\phi_S$. The source of the MOS transistor 7 is connected via a capacitor 11 to the gate of an enhancement-type output MOS transistor 9, and the junction between the source of the MOS transistor 7 and the capacitor 11 is grounded via a capacitor 12 while being connected to the drain of a gating MOS transistor 10.

The drain of a gating MOS transistor 8 is connected to a terminal 2 to which the bias voltage $V_B$ is applied, and the gate thereof is connected to a terminal 3 to be fed with a blanking pulse $\phi_{BLK}$. Meanwhile the source of the MOS transistor 8 is connected to the gate of the output MOS transistor 9. The gate of the gating MOS transistor 10 is connected to the terminal 3 to be fed with a blanking pulse $\phi_{BLK}$, and the source thereof is connected to the source of the MOS transistor 9.

The drain of the output MOS transistor 9 is connected to a power terminal 5 while a constant current supply 13 is connected to the source thereof, from which an output terminal 6 is led out.

The terminal 2 is fed with a predetermined bias voltage $V_B$ substantially equivalent to the mean level of the input signal, and the terminal 3 is fed with a blanking pulse $\phi_{BLK}$ of FIG. 2B while the terminal 4 is fed with a sampling pulse $\phi_S$ of FIG. 2C.

In the circuit configuration described above signals of FIG. 2A are produced in the individual stages.

When a blanking pulse $\phi_{BLK}$ is fed, the transistors 8 and 10 are turned on so that the potential at the gate (point ②) of the MOS transistor 9 becomes $V_B$ as shown by a one-dot chain line in FIG. 2A while the potential at the source (point ③) is reduced by $V_{GS}$ through the MOS transistor 9 to become $V_B - V_{GS}$ as shown by a broken line in FIG. 2A, whereby the potential at the junction (point ④) of the MOS transistor 10 and the capacitor 12 is changed as $V_B - V_{GS}$. Consequently the potential difference between the points ② and ④ becomes as follows, and a charge corresponding to such potential difference is stored in the capacitor 11.

$$V_B - (V_B - V_{GS}) = V_{GS}$$

The MOS transistors 8 and 10 are turned off in the state described above, and then a sampling pulse $\phi_S$ is fed. In case the potential at the input terminal 1 (point ①) is $V_{S1}$ when a first sampling pulse $\phi_{S1}$ is fed, the potential $V_{S1}$ is obtained also at the point ④. Since the charge corresponding to the aforesaid potential difference $V_{GS}$ is previously stored in the capacitor 11 between the points ④ and ② in response to the blanking pulse $\phi_{BLK}$, the potential at the point ② is increased to be $V_{S1}+V_{GS}$. As a result, the potential at the point ③ becomes $$(V_{S1}+V_{GS})-V_{GS}=V_{S1}$$

which is equal to the potential at the input terminal 1 (point ①).

The above operation is performed at each sampling time and therefore enables the sampled potential to appear at the output without any variation despite the drop of $V_{GS}$ induced by the buffer.

In case the above embodiment of the present invention is used as a buffer circuit, a pulse held at a high level as shown in FIG. 3B is fed to the terminal 4 in relation to an input video signal of FIG. 3A. And the configuration may be so designed that the offset voltage $V_{GS}$ of the MOS transistor 9 is stored in the capacitor 11 in response to a blanking pulse of FIG. 3C fed per blanking period of the video signal.

FIG. 4 shows another embodiment of the present invention applied to an analog delay circuit, in which two of the foregoing embodiment of FIG. 1 are arrayed in cascade connection.

A first sample-and-hold circuit comprises gating MOS transistors 27, 28 and 30; capacitors 31 and 32; an output MOS transistor 29 and a constant current supply 33 similarly to the aforesaid exemplary embodiment. Meanwhile a second sample-and-hold circuit comprises gating MOS transistors 37, 38 and 40; capacitors 41 and 42; an output MOS transistor 39 and a constant current supply 43 similarly to the above.

In FIG. 4, an input terminal 21 is connected to the drain of the MOS transistor 27, whose gate is connected to a terminal 24 to be fed with a first sampling pulse $\phi_{S1}$. A terminal 22, to which a bias voltage $V_B$ is applied, is connected to the respective drains of the MOS transistors 28 and 38, while a terminal 23 to be fed with a blanking pulse $\phi_{BLK}$ is connected to the respective gates of the mos transistors 28, 30 and 40. The source of the output MOS transistor 29 is connected to the drain of the MOS transistor 37, whose gate is connected to a terminal 34 to be fed with a second sampling pulse $\phi_{S2}$. A power terminal 25 is connected to the respective drains of the output MOS transistors 29 and 39, and an output terminal 36 is led out from the source of the output MOS transistor 39.

A blanking pulse $\phi_{BLK}$ of FIG. 5A is fed to the terminal 23, and offset voltages $V_{GS}$ of the output MOS transistors 29 and 39 are stored respectively in the capacitors 31 and 41. In response to a first sampling pulse $\phi_{S1}$ of FIG. 5B, an input signal is sampled and held to appear as an output at the source of the MOS transistor 29. The output thus produced is then fed to the drain of the MOS transistor 37. And when a second sampling pulse $\phi_{S2}$ of FIG. 5C having a predetermined phase lag with respect to the first sampling pulse $\phi_{S1}$ is fed to a terminal 34, the output of the preceding stage is sampled in response to the second sampling pulse $\phi_{S2}$. Consequently an output delayed for the phase lag between the second sampling pulse $\phi_{S2}$ and the first sampling pulse $\phi_{S1}$ is obtained at an output terminal 36.

FIG. 6 shows another embodiment of the present invention applied to an analog serial-parallel conversion circuit, in which two of the foregoing embodiment shown in FIG. 4 are connected in parallel with each other.

A first delay circuit comprises gating MOS transistors 57, 58, 60, 67, 68 and 70; capacitors 61, 62, 71 and 72; output MOS transistors 59 and 69; and constant current supplies 63 and 73 in the same configuration as that of FIG. 4. A second delay circuit comprises gating MOS transistors 77, 78, 80, 87, 88 and 90; capacitors 81, 82, 91 and 92; output MOS transistors 79 and 89; and constant current supplies 83 and 93 connected in the same configuration as that of FIG. 4.

In FIG. 6, an input terminal 51 is connected to the respective drains of the MOS transistors 57 and 77, and the gate of the MOS transistor 57 is connected to a terminal 54 to be fed with a first sampling pulse $\phi_{S1}$. A terminal 52, to which a bias voltage $V_B$ is applied, is connected to the respective drains of the MOS transistors 58 and 68, while a terminal 53 to be fed with a blanking pulse $\phi_{BLK}$ is connected to the respective gates of the MOS transistors 58, 60, 68 and 70. A power terminal 55 is connected to the respective drains of the output MOS transistors 59 and 69. And a first output terminal 66 is led out from the source of the output MOS transistor 69.

A terminal 74 to be fed with a second sampling pulse $\phi_{S2}$ is connected to the respective gates of the MOS transistors 67 77 and 87. And a terminal 76, to which a bias voltage $V_B$ is applied, is connected to the respective drains of the MOS transistors 78 and 88, while a terminal 53 to be fed with a blanking pulse $\phi_{BLK}$ is connected to the respective gates of the MOS transistors 78, 80, 88 and 90. A power terminal 75 is connected to the respective drains of the output MOS transistors 79 and 89. And a second output terminal 86 is led out from the source of the output MOS transistor 89.

A blanking pulse $\phi_{BLK}$ of FIG. 7A is fed to the terminal 53, and offset voltages $V_{GS}$ of the output MOS transistors 59, 69, 79 and 89 are stored respectively in the capacitors 61, 71, 81 and 91. In response to a first sampling pulse $\phi_{S1}$ of FIG. 7B, an input signal (FIG. 7D) is sampled and held to appear as an output at the source (point ① in FIG. 6) of the MOS transistor 59. The output (FIG. 7E) thus produced is then fed to the drain of the MOS transistor 67. When a second sampling pulse $\phi_{S2}$ of FIG. 7C having a predetermined phase lag with respect to the first sampling pulse $\phi_{S1}$ is fed to a terminal 74, the output (FIG. 7E) of the preceding stage is sampled in response to the pulse $\phi_{S2}$. Consequently an output (FIG. 7G) delayed for the phase lag between the second sampling pulse $\phi_{S2}$ and the first sampling pulse $\phi_{S1}$ is obtained at an output terminal 66.

The input signal at this moment is sampled in response to the sampling pulse $\phi_{S2}$, so that an output (FIG. 7F) comes to appear at the source (point ② in FIG. 6) of the MOS transistor 79. The output (FIG. 7F) thus produced is sent via the MOS transistors 87 and 89 to the output terminal 86. That is, the input signal rendered parallel as shown in FIGS. 7G and 7H is obtained from the output terminals 66 and 86.

Figure 8:
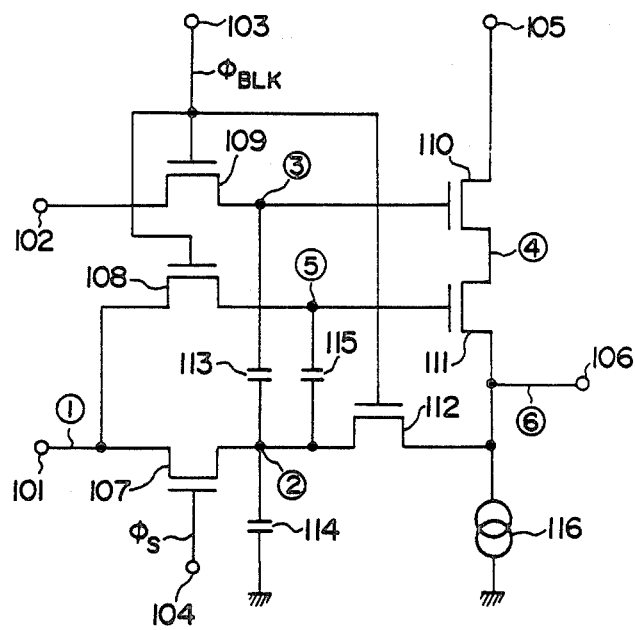
FIG. 8 is a connection diagram of a further embodiment of the present invention.

A further embodiment of the present invention in which the input capacity of the output transistor can be reduced will be described with reference to the FIG. 8 through FIG. 11. In FIG. 8, shown at 101 is an input terminal to which a video signal or the like is fed.

The drain of a gating MOS transistor 107 is connected to the input terminal 101, and the gate thereof is connected to a terminal 104 to be fed with a sampling pulse $\phi_S$.

The source of the MOS transistor 107 is connected via a capacitor 115 to the gate of an enhancement-type output MOS transistor 111. The junction between the source of the MOS transistor 107 and the capacitor 115 is grounded via a capacitor 114 while being connected via a capacitor 113 to the gate of a MOS transistor 110.

The respective gates of MOS transistors 108, 109 and 112 are connected to a terminal 103 to be fed with a blanking pulse $\phi_{BLK}$. The drain of the MOS transistor 108 is connected to the input terminal 101, and the source thereof is connected to the gate of the output MOS transistor 111. The drain of the MCS transistor 109 is connected to a terminal 102 to which a DC voltage $V_{DC1}$ is applied, and its source is connected to the gate of the MOS transistor 110. The drain of the MOS transistor 112 is connected to the source of the MOS transistor 107, and the source of the MOS transistor 112 is connected to the source of the output MOS transistor 111.

The drain of the MOS transistor 110 is connected to a power terminal 105, and its source is connected to the drain of the output MOS transistor 111. Meanwhile a constant current supply 116 is connected to the source of the MOS transistor 111, from which an output terminal 106 is led out.

Figure 9A:
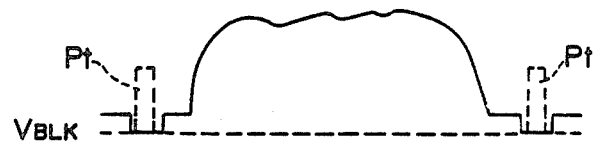
FIG. 9a–9c waveform charts of signals for explaining the operation in the embodiment of FIG. 8.
Figure 9B:
Figure 9C:

An input such as a video signal of FIG. 9A is fed to the input terminal 101. The minimum level of the video signal or the sync tip level $V_{BLK}$ thereof during the blanking period is so set as to exceed the threshold voltage $V_{th}$ of the output MOS transistor 111. To the terminal 102, there is applied from a DC voltage supply a voltage $V_{DC1}$ which is higher than the sync tip level $V_{BLK}$ and hence further higher than the threshold voltage $V_{th}$ of the MOS transistor 110. The terminal 103 is fed with a blanking pulse $\phi_{BLK}$ of FIG. 9B, while the terminal 104 is fed with a sampling pulse $\phi_S$ of FIG. 9C.

When a blanking pulse $\phi_{BLK}$ is fed to the terminal 103, the MOS transistors 108, 109 and 112 are turned on. Upon conduction of the MOS transistor 109, the potential at the gate (point ③ in FIG. 8) of the MOS transistor 110 is equalized to the DC voltage $V_{DC1}$ applied via the terminal 102. Consequently, the potential at the source (point ④ in FIG. 8) of the MOS transistor 110 is reduced by the gate-source offset voltage $V_{GS110}$ as $V_{DC1}-V_{GS110}$.

Upon conduction of the MOS transistor 108 in response to the blanking pulse $\phi_{BLK}$, the potential at the gate (point ⑤ in FIG. 8) of the output MOS transistor 111 is equalized to the instantaneous potential at the input terminal 101 (point ① in FIG. 8) to become $V_{BLK}$. As a result, the potential at the source (point ⑥ in FIG. 8) of the output MOS transistor 111 is reduced by the gate-source offset voltage $V_{GS111}$ as $V_{BLK}-V_{GS111}$. Due to conduction of the MOS transistor 112 in response to the blanking pulse $\phi_{BLK}$, the potential at the junction (point ② in FIG. 8) between the MOS transistor 112 and the capacitor 114 is also reduced as $V_{BLK}-V_{GS111}$.

Therefore the potential difference between the points ③ and ② becomes as follows, and a charge corresponding to such potential difference is stored in the capacitor 113.

$$V_{DC1}-(V_{BLK}-V_{GS111})$$

Meanwhile, the potential difference between the points ⑤ and ② becomes as follows, and a, charge corresponding thereto is stored in the capacitor 115.

$$V_{BLK}-(V_{BLK}-V_{GS111})=V_{GS111}$$

The MOS transistors 108, 109 and 112 are turned off in the state described above, and then a sampling pulse $\phi_S$ is fed to the terminal 104. The MOS transistor 107 is turned on by the sampling pulse $\phi_S$, and the potential at the point ② is equalized to the instantaneous potential at the input terminal 101 (point ① in FIG. 8) to become $V_S$, for example.

Since the charge corresponding to $V_{DC1}-(V_{BLK}-V_{GS111})$ is stored in the capacitor 113 between the points ③ and ② in response to the blanking pulse $\phi_{BLK}$ as described previously, the potential at the point ③ is altered to $V_S+V_{DC1}-(V_{BLK}-V_{GS111})$. Accordingly, the potential at the point ④ is changed to $$V_S+V_{DC1}-(V_{BLK}-V_{GS111})-V_{GS110}$$

Furthermore, as also described previously, the charge corresponding to $V_{GS111}$ is stored in the capacitor 115 between the points ⑤ and ② in response to the blanking pulse $\phi_{BLK}$, so that the potential at the point ⑤ is altered to $V_S+V_{GS111}$. Accordingly, the potential at the point ⑥ is changed to $$V_S+V_{GS111}-V_{GS111}=V_S$$

Thus, the output voltage equalized to the input voltage applied to the input terminal 101 is obtained from the output terminal 106. The above operation is performed at each sampling time and therefore enables the sampled potential to appear at the output without any variation despite the drop of $V_{GS}$ induced by the buffer.

Furthermore, each of the alternating potential variations at the drain and the source of the output MOS transistor 111 is $V_S$ so that the apparent input capacity $C_{IN}$ as viewed from the input signal source is reduced to nil.

When it is necessary in the above-described embodiment of the present invention to take into consideration the dynamic range of the circuit or any $V_{GS}$ variation caused by the Early effect, a positive pilot signal represented by a broken line Pt in FIG. 9A may additionally be provided during the blanking period of the video signal fed to the input terminal 101. In such a case, the pilot signal Pt is inserted in the high-level duration of the blanking pulse $\phi_{BLK}$, and the peak level of the pilot signal Pt is set to be substantially equal to the mean level of the input signal.

By the use of such pilot signal Pt, the offset voltage $V_{GS111}$ at the same operation point as the signal level can be stored in the capacitor 115 in response to the blanking pulse $\phi_{BLK}$. Moreover, since the peak level of the pilot signal Pt is substantially equalized to the mean level of the input signal, it is not necessary to set the sync tip level $V_{BLK}$ of the input signal to be higher than the threshold voltage $V_{th}$ of the output MOS transistor, hence minimizing the required dynamic range of the circuit.

In a modification, an additional terminal may be provided separately from the input terminal 101 to receive a DC voltage equivalent to the mean level of the input signal, and the drain of the MOS transistor 108 may be connected to such terminal instead of the input terminal 101.

The output MOS transistor 111 of enhancement type employed in the above embodiment of the invention may be of depression type as well, and a bipolar transistor may be used in place of the MOS transistor.

FIG. 10 shows still further embodiment of the present invention contrived to constitute an analog delay circuit, wherein two of the foregoing embodiment of FIG. 8 are arrayed in cascade connection with a modification that the drain of the MOS transistor 108 is connected not to the input terminal but to an additional terminal provided separately to receive a DC voltage.

In this example, a first sample-and-hold circuit 120 comprises MOS transistors 127, 128, 129, 130 and 132; capacitors 133, 134 and 135; an output MOS transistor 131 and a constant current supply 136. Meanwhile a second sample-and-hold circuit 140 comprises MOS transistors 147, 148, 150 and 152; capacitors 153, 154 and 155; an output MOS transistor 151 and a constant current supply 156.

In FIG. 10, an input terminal 121 is connected to the drain of the MOS transistor 127, whose gate is connected to a terminal 124 to be fed with a first sampling pulse $\phi_{S1}$. A terminal 122, to which a DC voltage $V_{DC1}$ is applied, is connected to the respective drains of the MOS transistors 129 and 149, while a terminal 123 to be fed with a blanking pulse $\phi_{BLK}$ is connected to the respective gates of the MOS transistors 128, 129, 148 and 149. A terminal 137, to which a DC voltage $V_{DC2}$ is applied, is connected to the respective drains of the MOS transistors 128 and 148. A power terminal 125 is connected to the drain of the MOS transistor 130, and the source of the output MOS transistor 131 in the first sample-and-hold circuit 120 is connected to the drain of the MOS transistor 147 in the second sample-and-hold circuit 140. The gate of the MOS transistor 147 is connected to a terminal 144 to be fed with a second sampling pulse $\phi_{S2}$. Furthermore, a power terminal 145 is connected to the drain of the MOS transistor 150, and an output terminal 146 is led out from the source of the output MOS transistor 151.

A video signal is fed to the input terminal 121, and a DC voltage $V_{DC2}$ substantially equalized to the mean level of the video signal is applied to the terminal 137. A blanking pulse $\phi_{BLK}$ of FIG. 11A is fed to the terminal 123, so that the offset voltage $V_{DC2} - (V_{DC2} - V_{GS111}) = V_{GS111}$ of the output MOS transistors 131 and 151 is stored in each of the capacitors 135 and 155. Meanwhile the voltage $V_{DC1} - (V_{DC2} - V_{GS111})$ is stored in each of the capacitors 133 and 135.

The voltage at the drain of the output MOS transistor 131 is altered to $V_S + V_{DC1} - (V_{DC2} - V_{GS111}) - V_{GS111}$ in response to the first sampling pulse $\phi_{S1}$ of FIG. 11B, whereby the input capacity of the output MOS transistor 131 is reduced to nil alternatingly. At the source of the MOS transistor 131 is obtained a sample holding output $V_S$ in which the offset voltage $V_{GS111}$ has already been canceled relative to the input voltage. This output is fed to the drain of the MOS transistor 147 in the second sample-and-hold circuit 140, and a second sampling pulse $\phi_{S2}$ of FIG. 11C having a predetermined phase lag with respect to the first sampling pulse $\phi_{S1}$ is fed to the terminal 144. Then the first output $V_S$ of the preceding stage is sampled in response to the second sampling pulse $\phi_{S2}$. This time the voltage at the drain of the output MOS transistor 151 is altered to $V_S + V_{DC1} - (V_{DC2} - V_{GS111}) - V_{GS110}$, whereby the input capacity of the output MOS transistor 151 is reduced to nil alternatingly.

Consequently an output delayed for the phase lag between the second sampling pulse $\phi_{S2}$ and the first sampling pulse $\phi_{S1}$ is obtained at the output terminal 146.

In addition to the above embodiment where two states of sample-and-hold circuits are arrayed in cascade connection, the present invention is applicable also to another arrangement employing three or more stages of sample-and-hold circuits in cascade connection. And it is to be further understood that the latter embodiment is applicable to a series-parallel conversion circuit as well.

According to the present invention, the offset voltage $V_{GS}$ of the MOS transistor in the output stage is held in the capacitor during the blanking period, and a composite signal obtained by adding such offset voltage $V_{GS}$ in the capacitor and the input voltage sampled and held in response to a sampling pulse is fed to the gate of the output-stage MOS transistor. It becomes possible, therefore, to provide an output voltage without inducing any offset voltage difference relative to the input voltage.

Furthermore, due to application of the bias voltage $V_B$ which is substantially equivalent to the mean level of the input signal, complete coincidence is attainable between the offset voltage sampled and held in response to a blanking pulse and the offset voltage at the time of sampling and holding the input signal, and there is achievable another advantage of minimizing the required dynamic range.

We claim:

1. A buffer circuit for translating a periodic input signal comprising; an input terminal supplied with the input signal, first gate means connected to said input terminal and being turned on during a first portion of a period of the input signal, first capacitive means connected to said first gate means; second capacitive means connected to the connection point of said first capacitive means and said first gate means, a source (emitter) follower transistor having a gate (base) connected to said second capacitive means, a source (emitter) and a drain (collector), second gate means connected between the source (emitter) of said source (emitter) follower transistor and said connection point of said first gate means and said first capacitive means, said second gate means being turned on during a second portion of a period of the input signal, third gate means connected to the gate (base) of said source (emitter) follower transistor and being turned on during the second portion of a period of the input signal whereby a the gate-source (base-emitter) offset voltage of said source (emitter) follower transistor is stored across said second capacitive means during the second portion of a period of the input signal, an output terminal led out from the source (emitter) of said source (emitter) follower transistor, said first portion is a trace duration of a horizontal scanning period of the video signal and said second portion is a blanking duration of a horizontal scanning period of the video signal, and wherein said third gate means is connected between the gate (base) of said source (emitter) follower transistor and a voltage source with an average voltage level of said video signal.

2. A buffer circuit according to claim 1, wherein said periodic input signal is a video signal, said first portion is a trace duration of a horizontal scanning period of the video signal and said second portion is a blanking duration of a horizontal scanning period of the video signal.

3. A buffer circuit according to claim 1, wherein said first gate means is periodically switched during the first portion of a period of said input signal such that the buffer circuit operates as a sampling hold circuit.

4. A buffer circuit for translating a periodic input signal comprising; an input terminal supplied with the input signal, first gate means connected to said input terminal and being turned on during a first portion of a period of the input signal, first capacitive means connected to said first gate means, second capacitive means connected to the connection point of said first capacitive means and said first gate means, a source (emitter) follower transistor having a gate (base) connected to said second capacitive means, a source (emitter) and a drain (collector), second gate means connected between the source (emitter) of said source (emitter) follower transistor and said connection point of said first gate means and said first capacitive means, said second gate means being turned on during a second portion of a period of the input signal, third gate means connected to the gate (base) of said source (emitter) follower transistor and being turned on during the second portion of a period of the input signal whereby the gate-source (base-emitter) offset voltage of said source (emitter) follower transistor is stored across said second capacitive means during the second portion of a period of the input signal, an output terminal led out from the source (emitter) of said source (emitter) follower transistor, and further comprising a fourth gate means which is turned on during the second portion of a period of said input signal, third capacitive means connected between said fourth gate means and the connection point of the said first gate means and said first capacitive means, and a transistor having a gate connected to said fourth gate means, source connected to the drain (collector) of said source (emitter) follower transistor and a drain.

* * * * *